United States Patent
Choi

(10) Patent No.: US 8,441,875 B2
(45) Date of Patent: May 14, 2013

(54) MAT COMPRESS CIRCUIT AND SEMICONDUCTOR MEMORY DEVICE HAVING THE SAME

(75) Inventor: Young Geun Choi, Gyeonggi-do (KR)

(73) Assignee: Hynix Semicondcutor Inc., Gyeonggi-do (KR)

( * ) Notice: Subject to any disclaimer, the term of this patent is extended or adjusted under 35 U.S.C. 154(b) by 717 days.

(21) Appl. No.: 12/650,717

(22) Filed: Dec. 31, 2009

(65) Prior Publication Data

US 2010/0302886 A1    Dec. 2, 2010

(30) Foreign Application Priority Data

May 28, 2009    (KR) .......................... 10-2009-0047142

(51) Int. Cl.
*G11C 7/00*    (2006.01)
(52) U.S. Cl.
USPC ........................................................ 365/201

(58) Field of Classification Search ............. 365/203.03, 365/201
See application file for complete search history.

(56) References Cited

U.S. PATENT DOCUMENTS 7,573,776 B2    8/2009    Kim
2005/0166097 A1*    7/2005    An ................................. 714/42

FOREIGN PATENT DOCUMENTS

KR    1020090024455 A    3/2009

* cited by examiner

*Primary Examiner* — Hoai V Ho
(74) *Attorney, Agent, or Firm* — Ladas & Parry LLP

(57) ABSTRACT

A mat compress circuit includes a pre-control signal generator that generates a first pre-control signal and a second pre-control signal alternatively activated in response to an up/down bank selection address in a mat compression test, and a control signal transmitter that inverts and transfers the first and second pre-control signals in response to a switching signal activated when there is an input of a block selection address in the mat compression test.

22 Claims, 6 Drawing Sheets

FIG.1
(PRIOR ART)

|  |  | A11 | A10 | A9 | A8 | A7 |  |
|---|---|---|---|---|---|---|---|
| MAT<1> | 1st block | 0 | 0 | 0 | 0 | 0 | UP BANK |
|  | 2nd block | 0 | 0 | 0 | 0 | 1 |  |
|  | 3rd block | 0 | 0 | 0 | 1 | 0 |  |
| MAT<2> | 1st block | 0 | 0 | 0 | 1 | 1 |  |
|  | 2nd block | 0 | 0 | 1 | 0 | 0 |  |
|  | 3rd block | 0 | 0 | 1 | 0 | 1 |  |
| MAT<3> | 1st block | 0 | 0 | 1 | 1 | 0 |  |
|  | 2nd block | 0 | 0 | 1 | 1 | 1 |  |
|  | 3rd block | 0 | 1 | 0 | 0 | 0 |  |
| MAT<4> | 1st block | 0 | 1 | 0 | 0 | 1 |  |
|  | 2nd block | 0 | 1 | 0 | 1 | 0 |  |
|  | 3rd block | 0 | 1 | 0 | 1 | 1 |  |
| MAT<5> | 1st block | 0 | 1 | 1 | 0 | 0 |  |
|  | 2nd block | 0 | 1 | 1 | 0 | 1 |  |
|  | 3rd block | 0 | 1 | 1 | 1 | 0 |  |
| MAT<6> | 1st block | 0 | 1 | 1 | 1 | 1 | DOWN BANK |
|  | 2nd block | 1 | 0 | 0 | 0 | 0 |  |
|  | 3rd block | 1 | 0 | 0 | 0 | 1 |  |
| MAT<7> | 1st block | 1 | 0 | 0 | 1 | 0 |  |
|  | 2nd block | 1 | 0 | 0 | 1 | 1 |  |
|  | 3rd block | 1 | 0 | 1 | 0 | 0 |  |
| MAT<8> | 1st block | 1 | 0 | 1 | 0 | 1 |  |
|  | 2nd block | 1 | 0 | 1 | 1 | 0 |  |
|  | 3rd block | 1 | 0 | 1 | 1 | 1 |  |
| MAT<9> | 1st block | 1 | 1 | 0 | 0 | 0 |  |
|  | 2nd block | 1 | 1 | 0 | 0 | 1 |  |
|  | 3rd block | 1 | 1 | 0 | 1 | 0 |  |
| MAT<10> | 1st block | 1 | 1 | 0 | 1 | 1 |  |
|  | 2nd block | 1 | 1 | 1 | 0 | 0 |  |
|  | 3rd block | 1 | 1 | 1 | 0 | 1 |  |
| MAT<11> | 1st block | 1 | 1 | 1 | 1 | 0 |  |
|  | 2nd block | 1 | 1 | 1 | 1 | 1 |  |

MAT COMPRESS CIRCUIT AND SEMICONDUCTOR MEMORY DEVICE HAVING THE SAME

CROSS-REFERENCES TO RELATED PATENT APPLICATION

The present application claims priority under 35 U.S.C 119(a) to Korean Application No. 10-2009-0047142, filed on May 28, 2009, in the Korean Intellectual Property Office, which is incorporated herein by reference in its entirety as set forth in full.

BACKGROUND

This disclosure relates generally to a mat compress circuit, and more particularly to a mat compress circuit conducting a mat compression test in a semiconductor memory device.

Generally, after completing the fabrication of semiconductor memory devices, a test operation is conducted to find any malfunctions or defective states in the devices by writing data of high or low levels (e.g., '1' and '0') into all memory cells and reading out the data from the memory cells in sequence. As the number of memory cells is continues to increase along with higher integration density of semiconductor memory devices, the test time for finding malfunctions in the memory cells increases, which is problematic.

To solve such a problem in testing the memory cells, a mat compression test scheme capable of finding malfunctions from a plurality of memory cells at the same time has been proposed. The above mat compression test is different from the former scheme that respectively screens memory cells in sequence.

The mat compression test is conducted, for the purpose of reducing a test time, by grouping mats of each bank into up and down banks and concurrently executing writing and reading operations to a plurality of memory cells after activating word lines included in the up and down banks. The mat compression test operation described above is shown in FIG. 1.

Referring to FIG. 1, a semiconductor memory device having four banks in the integration density of 128 Mb is comprised of first through eleventh mats MAT<1:11>. Each mat has first through third blocks. Each mat is formed of 128 (=$2^7$) word lines. In the first through eleventh mats MAT<1:11>, each of the blocks from the first block of the first mat MAT<1> to the first block of the sixth mat MAT<6> are grouped into the up bank, while the each of the blocks from the second block of the sixth mat MAT<6> to the last block of the eleventh mat MAT<11> are grouped into the down bank.

In applying the mat compression test to the semiconductor memory device of the up and down banks shown in FIG. 1, the word lines belonging to the up and down banks are selected one by one in compliance with an up/down bank selection address A<11> and first through fourth block addresses A<7:10>. With two activated word lines, data are concurrently written into corresponding memory cells of the up and down banks. And then, input/output switching signals operate to read out the data from the down bank after reading the data from the up bank. Through this, it is possible to concurrently determine the states of two memory cells coupled to the activate word lines.

However, for the sixth mat MAT<6> in which the first block is included in the up bank while the second and third blocks are included in the down bank, there could be a malfunction during the mat compression test. This will be described in greater detail below.

If the first through fourth block addresses A<7:10> are all set on high levels, the first block of the sixth mat MAT<6> is selected. To conduct the reading and writing operations to the first block of the sixth mat MAT<6>, it is required to turn all of the sixth and seventh input/output switches (not shown) for controlling data input/output of the sixth mat MAT<6>.

Here, a control signal turning on the sixth input/output switch is arranged to be active, or high, when a mat of the up bank is selected, while a control signal turning on the seventh input/output switch is arranged to be active when a mat of the down bank is selected. Thus, the seventh input/output switch may not be turned on when the first block of the up bank is selected, although it must be enabled to select the first block of the sixth mat MAT<6>. Such a problem is usually occurs in a semiconductor memory device integrated in density of 256 Mb, rather than other devices of 512 Mb or 1 Gb in which memory cells are grouped into 44 or 88 mats by a multiple of 4.

SUMMARY

In an aspect of this disclosure, there is provided a mat compress circuit preventing a malfunction during a mat compression test operation, and a semiconductor memory device employing the same. The mat compress circuit according to the present invention drives all of bit-line sense amplifiers coupled to a selected mat by inverting phases of control signals for activating input/output switching signals when a block of a predetermined mat is selected.

In embodiments of the present invention, a mat compress circuit may include a pre-control signal generator configured to generate first and second pre-control signals alternatively activated in response to an up/down bank selection address in a mat compression test, and a control signal transmitter configured to invert and transfer the first and second pre-control signals in response to a switching signal activated if there is an input of a block selection address in the mat compression test.

In embodiments of the present invention, a semiconductor memory device may include a mat configured to include a first block belonging to an up bank and a second block belonging to a down bank, and to be shared by first and second bit-line sense amplifiers, a switching signal generator configured to generate a switching signal that is activated if the first block is selected in a mat compression test, a control signal generator configured to generate first and second control signals that are alternatively activated in response to an up/down bank selection address during the mat compression test, the first and second control signals being inverted in phase by responding to the switching signal, a first mat controller configured to control a data exchange between the first bit-line sense amplifier and a local input/output line in response to the first and second control signals, and a second mat controller configured to control a data exchange between the second bit-line sense amplifier and the local input/output line in response to the second control signal.

BRIEF DESCRIPTION OF THE DRAWINGS

The above and other aspects, features and other advantages will be more clearly understood from the following detailed description taken in conjunction with the accompanying drawings, in which:

FIG. 1 shows a table showing a general pattern of a mat compression test;

DESCRIPTION OF PREFERRED EMBODIMENTS

Hereinafter, embodiments of the present invention will be described with reference to accompanying drawings. However, the embodiments are for illustrative purposes only and are not intend to limit the scope of the invention.

Figure 2:
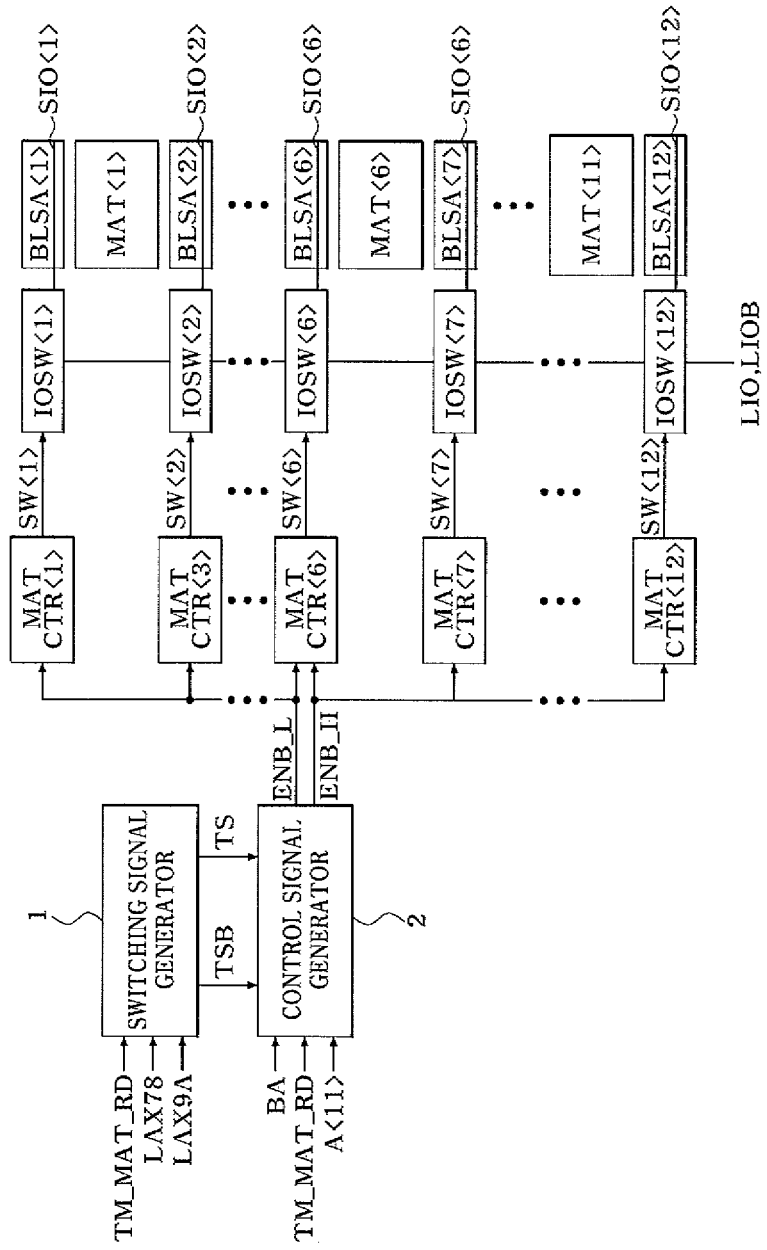
FIG. 2 is a block diagram showing an exemplary a configuration of a semiconductor memory device according to an embodiment of the present invention.

FIG. 2 shows a block configuration of a semiconductor memory device according to an embodiment of the present invention.

Referring to FIG. 2, the semiconductor memory device according to this embodiment is comprised of a switching signal generator 1, a control signal generator 2, first through twelfth mat controllers MATCTR<1:12>, first through twelfth input/output switches IOSW<1:12>, first through eleventh mats MAT<1:11> and first through twelfth bit-line sense amplifiers BLSA<1:12>. In the mats MAT<1:11>, the first mat MAT<1> is the most significant mat while the eleventh mat MAT<11> is the least significant mat.

Figure 3:
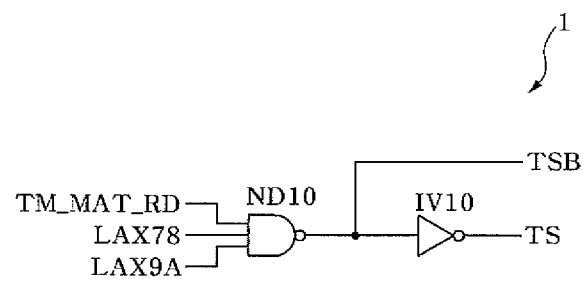
FIG. 3 is a circuit diagram showing the switching signal generator of the semiconductor memory device shown in FIG. 2.

Referring to FIG. 3, the switching signal generator 1 is includes a NAND gate ND10 and an inverter IV10. The NAND gate executes a NAND operation with a read flag signal TM_MART_RD, a first block selection address LAX78, and a second block selection address LAX9A and generates an inverted switching signal TSB. The inverter IV10 receives the inverted switching signal TSB and generates a switching signal TS by inverting the inverted switching signal TSB. Here, the read flag signal TM_MAT_RD is set on a low level when the mat compression test is conducting a writing operation, and set on a high level when the mat compression test is conducting a reading operation. The first block selection address LAX78 is a decoded signal that is generated in a high level when a first block address A<7> and a second block address A<8> are both at high levels. The second block selection address LAX9A is a decoded signal that is generated in a high level when a third block address A<9> and a fourth block address A<10> are both at high levels and an up/down bank selection address A<11> is at a low level. The first and second block selection addresses, LAX78 and LAX9A, may be designed to be decoded in various patterns. In this embodiment, it is preferred for the first and second block selection addresses LAX78 and LAX9A to be set all on high levels.

The switching signal generator 1 as shown in FIG. 3, operates to generate the switching signal active in a high level and the inverted switching signal active in a low level if the first and second block selection addresses LAX78 and LAX9A are all input with high levels, i.e., if the first block of the sixth mat MAT<6> is selected, in the condition that the read flag signal TM_MAT_RD is conditioned on a high level.

Figure 4:
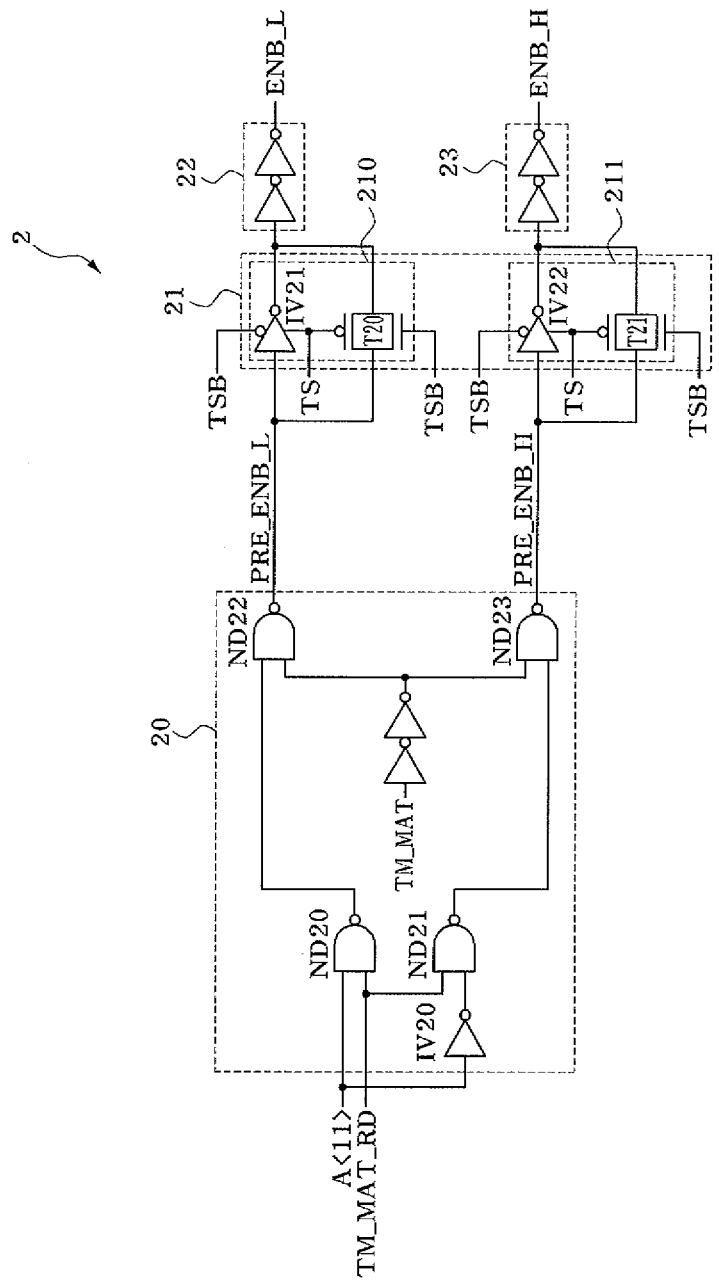
FIG. 4 is a circuit diagram showing the control signal generator of the semiconductor memory device shown in FIG. 2.

As shown in FIG. 4, the control signal generator 2 includes a pre-control signal generator 20, a control signal transmitter 21, a first buffer 22, and a second buffer 23.

The pre-control signal generator 20 includes a NAND gates ND20-ND23 and an inverter IV20. The NAND gate ND20 executes a NAND operation with the read flag signal TM_MAT_RD and the up/down bank selection address A<11>. The NAND gate ND21 executes a NAND operation with the read flag signal TM_MAT_RD and an inverted signal of the up/down bank selection address A<11> received from the inverter IV20. The NAND gate ND22 executes a NAND operation with a buffered signal of the test signal TM_MAT and an output signal of the NAND gate ND20 to generate a first pre-control signal PRE_ENB_L. The NAND gate ND23 executes a NAND operation with the buffered signal of the test signal TM_MAT and an output signal of the NAND gate ND21 to generate a second pre-control signal PRE_ENB_H. Here, the test signal TM_MAT may be designed to maintain a high level in the mat compression test mode. The up/down bank selection address A<11> may be designed to be in a low level while selecting the up bank, but in a high level while selecting the down bank.

In the pre-control signal generator 20 having the above configuration, for the reading operation, the first pre-control signal PRE_ENB_L is generated as being active in a low level when the up/down bank selection address A<11> is set to a low level, i.e., if the up bank is selected, while the read flag signal TM_MAT_RD is at a high level. Further, the second pre-control signal PRE_ENB_H is generated as being active in a low level when the up/down bank selection address A<11> is set to a high level, i.e., if the down bank is selected, while the read flag signal TM_MAT_RD is at a high level. Additionally, the pre-control signal generator 20 also generates the first and second pre-control signals PRE_ENB_L and PRE_ENB_H at low levels when the read flag signal TM_MAT_RD is at a low level.

The control signal transmitter 21 includes a first control signal transmitter 210 and a second signal transmitter 211. The first control signal transmitter 210 is composed of an inverter IV21 and a first transmission gate T20. The first control signal transmitter 210 operates as a buffer to inversely buffer and output the first pre-control signal PRE_ENB_L in response to the switching signal TS and the inverted switching signal TSB. The first transmission gate T20 transfers the first pre-control signal PRE_ENB_L in response to the switching signal TS and the inverted switching signal TSB. The second control signal transmitter 211 is composed of an inverter IV22 and a second transmission gate T21. The second control signal transmitter 211 operates as a buffer to inversely buffer and output the second pre-control signal PRE_ENB_H in response to the switching signal TS and the inverted switching signal TSB. The transmission gate T20 transfers the second pre-control signal PRE_ENB_H in response to the switching signal TS and the inverted switching signal TSB.

The control signal transmitter 21, having the configuration shown in FIG. 4, outputs signals in phase with the first pre-control signal PRE_ENB_L and the second pre-control signal PRE_ENB_H when the switching signal TS is at a low level and the inverted switching signal TSB is at a high level. Further, when the switching signal TS is at a low level and the inverted switching signal TSB is at a high level, the control signal transmitter 21 outputs signals with phases inverse to the first and second pre-control signals PRE_ENB_L and PRE_ENB_H.

The first buffer 22 buffers one of the output signal of the inverter IV21 and the transmission gate T20 to output a first control signal ENB_1. The second buffer 23 buffers one of the output signal of the inverter IV22 and the transmission gate T21 to output a second control signal ENB_2.

As shown in FIG. 2, the first mat controller MATCTR<1> generates a first input/output switching signal SW<1> that is activated when the first mat MAT<1> is selected. Here, selecting the first mat MAT<1> means that the first through third blocks of the first mat MAT<1> are selected. The second mat controller MATCTR<2> generates a second input/output switching signal SW<2> that is activated to a high level in response to the first control signal ENB_L activated in a low level when one of the first mat MAT<1> and the second mat MAT<2> is selected. The third mat controller MATCTR<3> generates a third input/output switching signal SW<3> that is activated to a high level in response to the first control signal ENB_L activated in a low level when one of the second mat MAT<2> and the third mat MAT<3> is selected. The fourth mat controller MATCTR<4> generates a fourth input/output switching signal SW<4> that is activated to a high level in response to the first control signal ENB_L activated in a low level when one of the fourth mat MAT<3> and the third mat MAT<4> is selected. The fifth mat controller MATCTR<5> generates a fifth input/output switching signal SW<5> that is activated to a high level in response to the first control signal ENB_L activated to a low level when one of the fourth mat MAT<4> and the fifth mat MAT<5> is selected.

Figure 5:
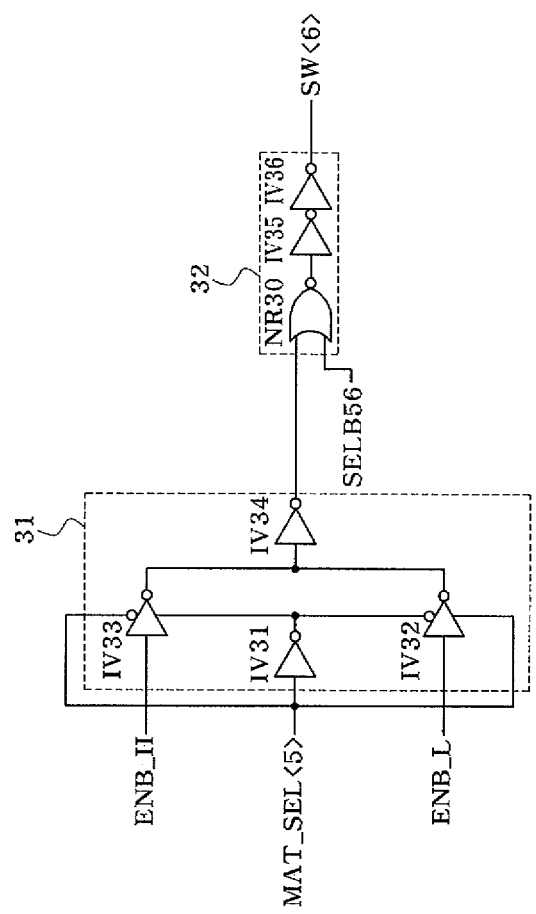
FIG. 5 is a circuit diagram showing the sixth mat controller of the semiconductor memory device shown in FIG. 2.

The sixth mat controller MATCTR<6>, as shown in FIG. 5, includes a selection buffer 31 and a buffer 32. The selection buffer 31 is composed of an inverters IV31-IV34. The inverter IV32 operates as a buffer inversely buffering the first control signal. ENB_L in response to an inverted signal of a mat selection signal MAT_SEL<5> output by the inverter IV31. The inverter IV33 operates as a buffer inversely buffering the second control signal ENB_H in response to the inverted signal of the mat selection signal MAT_SEL<5>. The inverter IV34 buffers the output signals of the inverters IV32 and IV33. The buffer 32 is composed of a NOR gate NR30 and inverters IV35 and IV36. The buffer 32 outputs a sixth input/output switching signal SW<6> by inversely buffering an output signal of the selection buffer 31 in response to a first mat selection decoding signal SELB56. Here, the mat selection signal MAT_SEL<6> is activated at a high level when the fifth mat MAT<5> is selected. The first mat selection decoding signal SELB56 is activated at a low level when one of the fifth mat MAT<5> and the sixth mat MAT<6> is selected.

Figure 6:
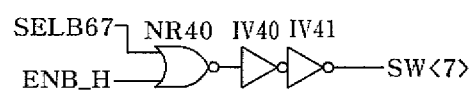
FIG. 6 is a circuit diagram showing the seventh mat controller of the semiconductor memory device shown in FIG. 2.

Referring to FIG. 6, the seventh mat controller MATCTR<7>, includes a NOR gate NR40 and inverters IV40 and IV41. The seventh mat controller MATCTR<7> outputs a seventh input/output switching signal SW<7> by inversely buffering the second control signal ENB_H in response to a second mat selection decoding signal SELB67. The seventh mat controller MATCTR<7>, configured as shown in FIG. 6, generates the seventh input/output switching signal SW<7>, which is activated to a high level in response to the second control signal ENB_H activated in a low level when one of the sixth mat MAT<6> and the seventh mat MAT<7> is selected. As described above, the first through fifth mat controllers MATCTR<1:5> can be implemented by means of the structure of the seventh mat controller MATCTR<7> shown in FIG. 6.

The eighth mat controller MATCTR<8> generates an eighth input/output switching signal SW<8> that is activated to a high level in response to the second control signal ENB_H activated in a low level when one of the seventh mat MAT<7> and the eighth mat MAT<8> is selected. The ninth mat controller MATCTR<9> generates a ninth input/output switching signal SW<9> that is activated to a high level in response to the second control signal ENB_H activated in a low level when one of the eighth mat MAT<8> and the ninth mat MAT<9> is selected. The tenth mat controller MATCTR<10> generates a tenth input/output switching signal SW<10> that is activated to a high level in response to the second control signal ENB_H activated in a low level when one of the ninth mat MAT<9> and the tenth mat MAT<10> is selected. The eleventh mat controller MATCTR<11> generates an eleventh input/output switching signal SW<11> that is activated to a high level in response to the second control signal ENB_H activated in a low level when one of the tenth mat MAT<10> and the eleventh mat MAT<11> is selected. The twelfth mat controller MATCTR<12> generates a twelfth input/output switching signal SW<12> that is activated to a high level when the eleventh mat MAT<11> is selected. Here, the eighth through twelfth mat controllers MATCTR<8:12> can be implemented by means of the structure of the seventh mat controller MATCTR<7> shown in FIG. 6.

As shown in FIG. 2, the first through twelfth input/output switches IOSW<1:12> are turned on in response to the first through twelfth switching signals SW<1:12>, which are activated in high levels, and control data exchange operations between first through twelfth segmented input/output lines SIO<1:12> and a pair of local input/output lines LIO and LIOB.

As shown in FIG. 1, each of the first through eleventh mats MAT<1:11> includes first through third blocks. Each block is comprised of 128 ($=2^7$) word lines. Among the first through eleventh mats MAT<1:11>, each of the blocks from the first block of the first mat MAT<1> to the first block of the sixth mat MAT<6> are grouped into the up bank, while each of the blocks from the second block of the sixth mat MAT<6> to last block of the eleventh mat MAT<11> are grouped into the down bank. Each of the first through eleventh mats MAT<1:11> is shared by two sense amplifiers. For instance, the sixth mat MAT<6> is shared by the sixth bit-line sense amplifier BLSA<6> and the seventh bit-line sense amplifier BLSA<7>. Thus, during the reading or writing operation in the mat compression test mode, a bit line of the sixth mat MAT<6> is connected with the sixth segmented input/output line SIO<6> through a switch (not shown) belonging to the sixth bit-line sense amplifier BLSA<6>, and a bit line of the sixth mat MAT<6> is connected with the seventh segmented input/output line SIO<7> through a switch (not shown) belonging to the seventh bit-line sense amplifier BLSA<7>.

As described above, the configuration of the semiconductor memory device according to this embodiment of the present invention is exemplified by the features with the first through twelfth input/output switches IOSW<1:12>, which control the data exchange operations between the first through twelfth segmented input/output lines SIO<1:12> and the pair of the local input/output lines LIO and LIOB, and with the first through twelfth mat controllers MATCTR<12>, which generate the first through twelfth input/output switching signals SW<1:12> enabling the first through twelfth input/output switches IOSW<1:12>. In addition to the compositions shown in FIGS. 2 through 6, the others necessary for conducting the mat compression test mode may be well known by those skilled in the art.

The mat compression test mode to the semiconductor memory device will be hereinafter described with regard to the writing operation for recording the same data into the first through twelfth mats MAT<1:12>, and the reading operation for reading data from the first through twelfth mats MAT<1:12>.

First, in the condition that the first through fourth block addresses A<7:10> are input in the state of '0000', the switching signal generator 1 outputs the switching signal TS inactivated at a low level and the inverted switching signal TSB inactivated in a high level. The control signal generator 2 outputs the first control signal ENB_L, which is active at a low level by the up/down bank selection address A<11> of low level, and the second control signal ENB_H being inactive in a high level by the up/down bank selection address A<11>. If the up/down bank selection address A<11> is set at a high level, the control signal generator 2 outputs the first control signal ENB_L, which is inactive in a high level, and the second control signal ENB_H being active in a low level.

The first block of the first mat MAT<1> is selected when the up/down bank selection address A<11> is set on a low level, and the first mat controller MATCTR<1> generates the first input/output switching signal SW<1> in a high level and the second mat controller MATCTR<2> generates the second input/output switching signal SW<2>, which is active in a high level, in response to the first control signal ENB_L of low level. The second block of the sixth mat MAT<6> is selected when the up/down bank selection address A<11> is set to a high level, and the sixth and seventh mat controllers MATCTR<6:7> generate the sixth and seventh input/output switching signals SW<6:7>, which are active in a high level, respectively, in response to the second control signal ENB_H of low level. Therefore, when the up/down bank selection address A<11> at a low level, the first and second input/output switching signals SW<1:2> are activated in a high level to enable the reading operation for the first block of the first mat MAT<1>, and when the up/down bank selection address A<11> is at a high level, the sixth and seventh input/output switching signals SW<6:7> are activated in a high level to enable the reading operation for the second block of the sixth mat MAT<6>.

While the first through fourth block address A<7:10> are being counted up by one bit, if the up/down bank selection address A<11> is at a low level, the reading operations are sequentially carried out from the second block of the first mat MAT<1> to the third block of the fifth mat MAT<3>. In contrast, if the up/down bank selection address A<11> is at a high level, the reading operations are sequentially carried out from the third block of the sixth mat MAT<6> to the first block of the eleventh mat MAT<11>.

Next, if the up/down bank selection address A<11> is at a low level and the first through fourth block addresses A<7:10> are input as '1111', i.e., if the first block of the sixth mat MAT<6> is selected, the first and second block selection addresses LAX78 and LAX9A all become high levels. Thus, the switching signal generator 1 outputs the switching signal TS activated in a high level and the inverted switching signal TSB activated in a low level.

The inverters IV21 and IV22 of the control signal generator 2 are enabled by the switching signal TS and the inverted switching signal TSB, when the switching signal TS and the inverted switching signal TSB are active in high and low levels respectively. The control signal generator 2 outputs the first control signal ENB_L inactivated in a high level and the second control signal ENB_H activated in a low level in response to the up/down bank selection address A<11>. That is, when the first block of the sixth mat MAT<6> is selected, the control signal generator 2 outputs the first control signal ENB_L and the second control signal ENB_H which are inverse to each other in phase.

Then, the sixth mat controller MATCTR<6> generates the sixth switching signal SW<6>, which is activated at a high level by the second control signal EMB_H inactivated at a low level. The seventh mat controller MATCTR<7> generates the seventh switching signal SW<7> that is activated in a high level by the second control signal EMB_H inactivated in a low level.

As stated above, in the semiconductor memory device according to the embodiment of the present invention, even when the first block of the sixth mat MAT<6>, having the blocks belonging to the up and down banks, is selected, the seventh input/output switching signal SW<7> is activated to a high level, as well as the sixth input/output switching signal SW<6>, by inversing the phases of the first control signal ENB_L and the second control signal ENB_H. Therefore, the sixth and seventh input/output switches IOSW<6:7> are all enabled to enable data of the sixth segmented input/output line SIO<6> or the seventh segmented input/output line SIO<7>, on which data of the sixth mat MAT<6> is loaded to be transferred into the pair of the local input/output lines LIO and LIOB.

While the present invention has been described with respect to the specific embodiments, it will be apparent to those skilled in the art that various changes and modifications may be made without departing from the spirit and scope of the invention as defined in the following claims.

What is claimed is:

1. A mat compress circuit, comprising:
   a pre-control signal generator configured to generate a first pre-control signal and a second pre-control signal alternatively activated in response to an up/down bank selection address in a mat compression test;
   a control signal transmitter configured to invert and transfer the first pre-control signal and the second pre-control signal to a first control signal and a second control signal in response to a switching signal activated according to an input of a block selection address in the mat compression test; and
   a mat controller configured to control a data exchange between a bit-line sense amplifier and a local input/output line in response to the first control signal and the second control signal.

2. The mat compress circuit of claim 1, wherein while a test signal for the mat compression test is activated, the pre-control signal generator activates the first pre-control signal if the up/down bank selection address is at a first logic level and activates the second pre-control signal if the up/down bank selection address is a second logic level.

3. The mat compress circuit of claim 2, wherein the pre-control signal generator comprises:
   a first logic element configured to buffer the up/down bank selection address in response to a read flag signal;
   a second logic element configured to buffer an inverted signal of the up/down bank selection address in response to the read flag signal;
   a third logic element configured to buffer an output signal of the first logic element in response to the test signal; and
   a fourth logic element configured to buffer an output signal of the second logic element in response to the test signal.

4. The mat compress circuit of claim 1, wherein the control signal transmitter comprises:
   a first control signal transmitter configured to transfer a signal inverted from one of the first pre-control signal and the second pre-control signal in response to the switching signal; and
   a second control signal transmitter configured to transfer a signal inverted from the other of the first pre control signal and the second pre-control signal.

5. The mat compress circuit of claim 4, wherein the first control signal transmitter comprises:
   a buffer configured to transfer an inverted signal of the first pre-control signal in response to the switching signal; and
   a transmission gate configured to transfer the first pre-control signal in response to the switching signal.

6. The mat compress circuit of claim 4, wherein the second control signal transmitter comprises:

a buffer configured to transfer an inverted signal of the second pre-control signal in response to the switching signal; and a transmission gate configured to transfer the second pre-control signal in response to the switching signal.

7. The mat compress circuit of claim 1, further comprising:
a first buffer and a second buffer configured to buffer an output signal of the control signal transmitter and to generate the first control signal and the second control signal, respectively, to control an input/output switching signal.

8. A semiconductor memory device, comprising:
a mat including a first block corresponding to an up bank and a second block corresponding to a down bank, the mat being shared by a first bit-line sense amplifier and a second bit-line sense amplifier;
a switching signal generator configured to generate a switching signal being activated when the first block is selected in a mat compression test;
a control signal generator configured to generate first control signal and a second control signal that are alternatively activated in response to an up/down bank selection address during the mat compression test, the first and second control signals being inverted in phase according to the switching signal;
a first mat controller configured to control a data exchange between the first bit-line sense amplifier and a local input/output line in response to the first control signal and the second control signal; and
a second mat controller configured to control a data exchange between the second bit-line sense amplifier and the local input/output line in response to the second control signal.

9. The semiconductor memory device of claim 8, wherein the switching signal generator comprises:
a logical element configured to logically combine a read flag signal and a block selection address and to output an inverted signal of the switching signal; and
a buffer configured to generate the switching signal by buffering an output signal of the logic element.

10. The semiconductor memory device of claim 8, wherein the control signal generator comprises:
a pre-control signal generator configured to generate a first pre-control signal and a second pre-control signal alternatively activated in response to the up/down bank selection address during the a mat compression test; and
a control signal transmitter configured to invert and transfer the first and second pre-control signals in response to the switching signal.

11. The semiconductor memory device of claim 10, wherein while a test signal for the mat compression test is activated, the pre-control signal generator activates the first pre-control signal if the up/down bank selection address is at a first logic level and activates the second pre-control signal if the up/down bank selection address is at a second logic level.

12. The semiconductor memory device of claim 11, wherein the pre-control signal generator comprises:
a first logic element configured to buffer the up/down bank selection address in response to a read flag signal;
a second logic element configured to buffer an inverted signal of the up/down bank selection address in response to the read flag signal;
a third logic element configured to buffer an output signal of the first logic element in response to the test signal; and a fourth logic element configured to buffer an output signal of the second logic element in response to the test signal.

13. The semiconductor memory device of claim 10, wherein the control signal transmitter comprises:
a first control signal transmitter configured to transfer a signal inverted from one of the first pre-control signal and the second pre-control signal in response to the switching signal; and
a second control signal transmitter configured to transfer a signal inverted from the other of the first pre-control signal and second pre-control signal.

14. The semiconductor memory device of claim 13, wherein the first control signal transmitter comprises:
a buffer configured to transfer an inverted signal the first pre-control signal in response to the switching signal; and
a transmission gate configured to transfer the first pre-control signal in response to the switching signal.

15. The semiconductor memory device of claim 13, wherein the second control signal transmitter comprises:
a buffer configured to transfer an inverted signal of the second pre-control signal in response to the switching signal; and
a transmission gate configured to transfer the second pre-control signal in response to the switching signal.

16. The semiconductor memory device of claim 10, wherein the control signal generator further comprises:
a first buffer and a second buffer configured to buffer an output signal of the control signal transmitter and generate a first control signal and a second control signal to control an input/output switching signal.

17. The semiconductor memory device of claim 16, wherein the first mat controller comprises:
a selection buffer configured to buffer and transfer alternatively the first and second control signals in response to a mat selection signal activated when a higher mat of the mat is selected; and
a buffer configured to buffer an output signal of the selection buffer in response to a mat selection decoding signal to generate the first input/output switching signal.

18. The semiconductor memory device of claim 17, wherein the selection buffer comprises:
a first selection buffer configured to buffer the first control signal in response to the mat selection signal; and
a second selection buffer configured to buffer the second control signal in response to the mat selection signal.

19. The semiconductor memory device of claim 17, wherein the mat selection decoding signal is activated when one of the mat and the higher mat of the mat is selected.

20. The semiconductor memory device of claim 10, wherein the second mat controller inverts and buffers the second control signal and to generate the second input/output switching signal in response to a mat selection decoding signal activated when one of the mat and a higher mat of the mat is selected.

21. The semiconductor memory device of claim 8, wherein the first bit-line sense amplifier is shared by the mat and a higher mat of the mat, alternatively connecting bit lines of the mat and the higher mat of the mat with a segmented input/output line.

22. The semiconductor memory device of claim 8, wherein the second bit-line sense amplifier is shared by the mat and a lower mat of the mat, alternatively connecting bit lines of the mat and the lower mat of the mat with a segmented input/output line.

* * * * *